United States Patent
Berke (10) Patent No.: US 7,876,592 B2
(45) Date of Patent: Jan. 25, 2011

(54) SYSTEM AND METHOD FOR SUPPORTING STANDARD AND VOLTAGE OPTIMIZED DIMMS

(75) Inventor: Stuart A. Berke, Austin, TX (US)

(73) Assignee: Dell Products, LP, Round Rock, TX (US)

( * ) Notice: Subject to any disclaimer, the term of this patent is extended or adjusted under 35 U.S.C. 154(b) by 142 days.

(21) Appl. No.: 12/327,292

(22) Filed: Dec. 3, 2008

(65) Prior Publication Data
US 2010/0135097 A1 Jun. 3, 2010

(51) Int. Cl.
*G11C 7/00* (2006.01)

(52) U.S. Cl. .................. 365/51; 365/189.05

(58) Field of Classification Search .............. 365/51, 365/189.05
See application file for complete search history.

(56) References Cited

U.S. PATENT DOCUMENTS

| | | | |
|---|---|---|---|
| 5,757,712 A | 5/1998 | Nagel et al. | |
| 7,360,104 B2 | 4/2008 | Harris et al. | |
| 2005/0266711 A1 | 12/2005 | Petersen et al. | |
| 2006/0277422 A1 | 12/2006 | Berke et al. | |
| 2006/0294437 A1* | 12/2006 | Washburn et al. | 714/42 |
| 2007/0016718 A1 | 1/2007 | Radhakrishnan et al. | |

* cited by examiner

*Primary Examiner*—Michael T Tran
(74) *Attorney, Agent, or Firm*—Larson Newman & Abel, LLP (57) ABSTRACT

A device includes a dynamic random access memory and a voltage regulator. The dynamic random access memory has a first input terminal connected to a first plurality of dual in-line memory module voltage pins, and a second input terminal. The dynamic random access memory is configured to receive a first voltage on the first input terminal. The voltage regulator has an input terminal connected to a second plurality of dual in-line memory module voltage pins, and an output terminal connected to the second input terminal of the dynamic random access memory. The voltage regulator is adapted to receive a second voltage, and configured to provide a third voltage to the second input terminal of the dynamic random access memory.

18 Claims, 7 Drawing Sheets

SYSTEM AND METHOD FOR SUPPORTING STANDARD AND VOLTAGE OPTIMIZED DIMMS

FIELD OF THE DISCLOSURE

This disclosure generally relates to information systems, and more particularly relates to a system and method for supporting standard and voltage optimized dual in-line memory modules.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements can vary between different applications, information handling systems can also vary regarding what information is handled, how the information is handled, how much information is processed, stored, or communicated, and how quickly and efficiently the information can be processed, stored, or communicated. The variations in information handling systems allow for information handling systems to be general or configured for a specific user or specific use such as financial transaction processing, airline reservations, enterprise data storage, or global communications. In addition, information handling systems can include a variety of hardware and software components that can be configured to process, store, and communicate information and can include one or more computer systems, data storage systems, and networking systems.

The amount of power used by the memory in servers and workstations has been steadily increasing, and can be the largest subsystem power consumer in the server or workstation. One reason for the increase power consumption of the memory is the increased number of dual in-line memory modules (DIMMs) per central processor unit socket. The power consumption can be reduced approximately linearly by lowering the operating voltage of the DIMMs. Additionally, the voltage supplied to the DIMM can be higher than the actual voltage required for the operation of a dynamic random access memory (DRAM), because different DIMM manufacturers can have different operating voltages for their DRAMs. Thus, the DIMM manufacturer can regulate the voltage supplied to the DIMM to the actual voltage required.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings can certainly be utilized in this application.

Figure 1:
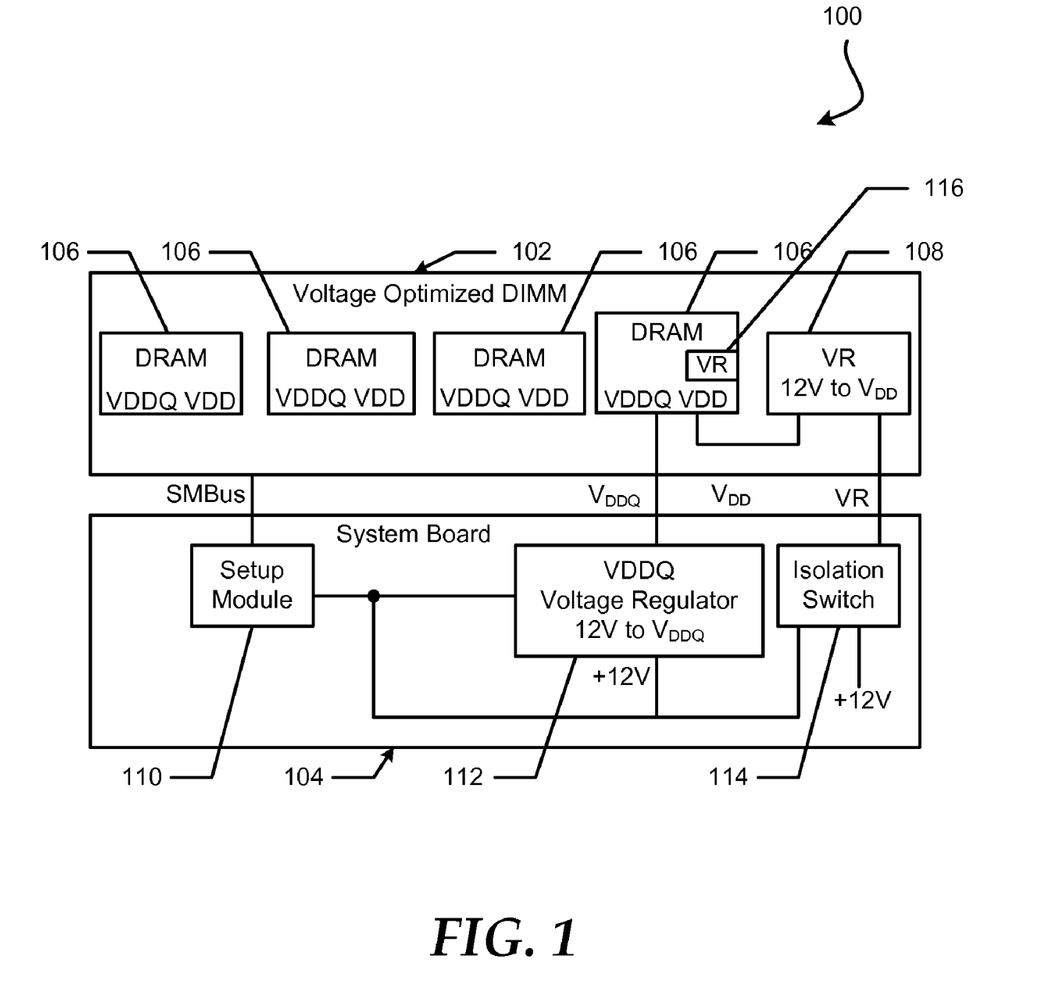
FIG. 1 is a block diagram of an embodiment of an information handling system including a voltage optimized dual in-line memory module and a system board.

FIG. 1 shows an information handling system 100. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network server or storage device, a switch router or other network communication device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communications between the various hardware components.

The information handling system 100 includes a voltage optimized dual in-line memory module (DIMM) 102 and a system board 104. The DIMM 102 includes dynamic random access memories (DRAMs) 106 and a voltage regulator 108. The system board 104 includes a setup module 110, a voltage regulator 112, and an isolation switch 114. The voltage regulator 108 is connected to the each of the DRAMs 106. The setup module 110 is in communication with a system management bus (SMBus) pin of the DIMM 102, with the voltage regulator 112, and with the isolation switch 114. The DIMM 102 is in communication with the system board 104 through a plurality of input voltage or VDD pins, only two of which are shown (labeled $V_{DDQ}$ and $V_R$) in FIG. 1. In particular, the voltage regulator 112 is in communication with each DRAM 106 via a respective VDDQ pin, and the isolation switch 114 is in communication with the voltage regulator 108 via a plurality of VR pins.

Certain parameters for the DIMM 102 are stored in an electrically erasable programmable read-only memory (EEPROM) (not shown) of the DIMM. The parameters can include timing parameters, manufacturer, serial number, voltage requirements, and the like about the DIMM 102. These parameters can be read by the setup module 110 through the SMBus pin via a serial presence detect (SPD) of the EEPROM. When the DIMM 102 and the system board 104 are activated, the setup module 110 can receive and read the SPD for the DIMM via the SMBus. The information in the SPD can enable the setup module 110 to automatically determine the different parameters about the DIMM 102. For example, based on the SPD, the setup module 110 can determine whether the DIMM 102 is a voltage optimized DIMM or a standard DIMM.

If the setup module 110 determines from the SPD that the DIMM 102 is a voltage optimized DIMM, the setup module can send an optimized signal to the voltage regulator 112 and to the isolation switch 114. The optimized signal can enable the voltage regulator 112 and the isolation switch 114. The voltage regulator 112 can receive a twelve volt input voltage, regulate the input voltage into a VDDQ voltage, and provide the $V_{DDQ}$ voltage to the VDDQ pins of the DRAMs 106 via the VDDQ pins of the DIMM 102. A double data rate input/output (DRR I/O) bus portion (not shown) of the DRAMs 106 preferably operates at the $V_{DDQ}$ voltage. Different types of DIMMs 102 have different operating voltages for the portions of the DIMM that use the $V_{DDQ}$ voltage. Thus, based on the type of the DIMM 102 read in the SPD, the voltage regulator 112 can be set to provide the $V_{DDQ}$ voltage at different voltages.

Additionally, the optimized signal can enable the isolation switch 114, such that the isolation switch provides the twelve volt input voltage to the voltage regulator 108 via the VR pins of the DIMM 102. The voltage regulator 108 can regulate the twelve volt voltage to provide a $V_{DD}$ voltage to the DRAMs 106 via the VDD pin of the DRAM. A core portion of the DRAMs 106 preferably operates at the $V_{DD}$ voltage.

The DRAMs 106 can have internal voltage regulators 116 that are configured to regulate the voltage received at the VDD pin of the DRAMs to a specific voltage required by the core portion of the DRAMs. However, the voltage regulator 108 provides the specific voltage required by the core portion at the VDD pin of the DRAM 106. As a result, the internal voltage regulator 116 of the DRAM can be bypassed. The DIMM manufacturer can set the internal voltage regulator 116 of the DRAM 106 to be bypassed by setting a fuse on the DRAM during the manufacturing process of the voltage optimized DIMM 102.

However, if the setup module 110 determines from the SPD that the DIMM 102 is a standard DIMM, the setup module can send a standard signal to the voltage regulator 112 and to the isolation switch 114. The standard signal can enable the voltage regulator to operate as described above to provide the $V_{DDQ}$ voltage to the DRAMs 106. The standard signal can disable the isolation switch 114, such that the twelve volt voltage is not provided to the DIMM 102. Thus, the DIMM 102 utilizes the VDDQ voltage to provide the necessary voltages to the different components in the DIMM.

Thus, based on whether the DIMM 102 is a standard DIMM or a voltage optimized DIMM, the system board 104 can provide either a single voltage or two different voltages to the VDD pins of the DIMM. The information handling system 100 preferably includes multiple DIMMs 102, and the system board 104 preferably provides the different voltages to each of the DIMMs connected to the system board. Additionally, it should be understood that the setup module 110 can be implemented in hardware, software, and/or any combination of both hardware and software.

Figure 2:
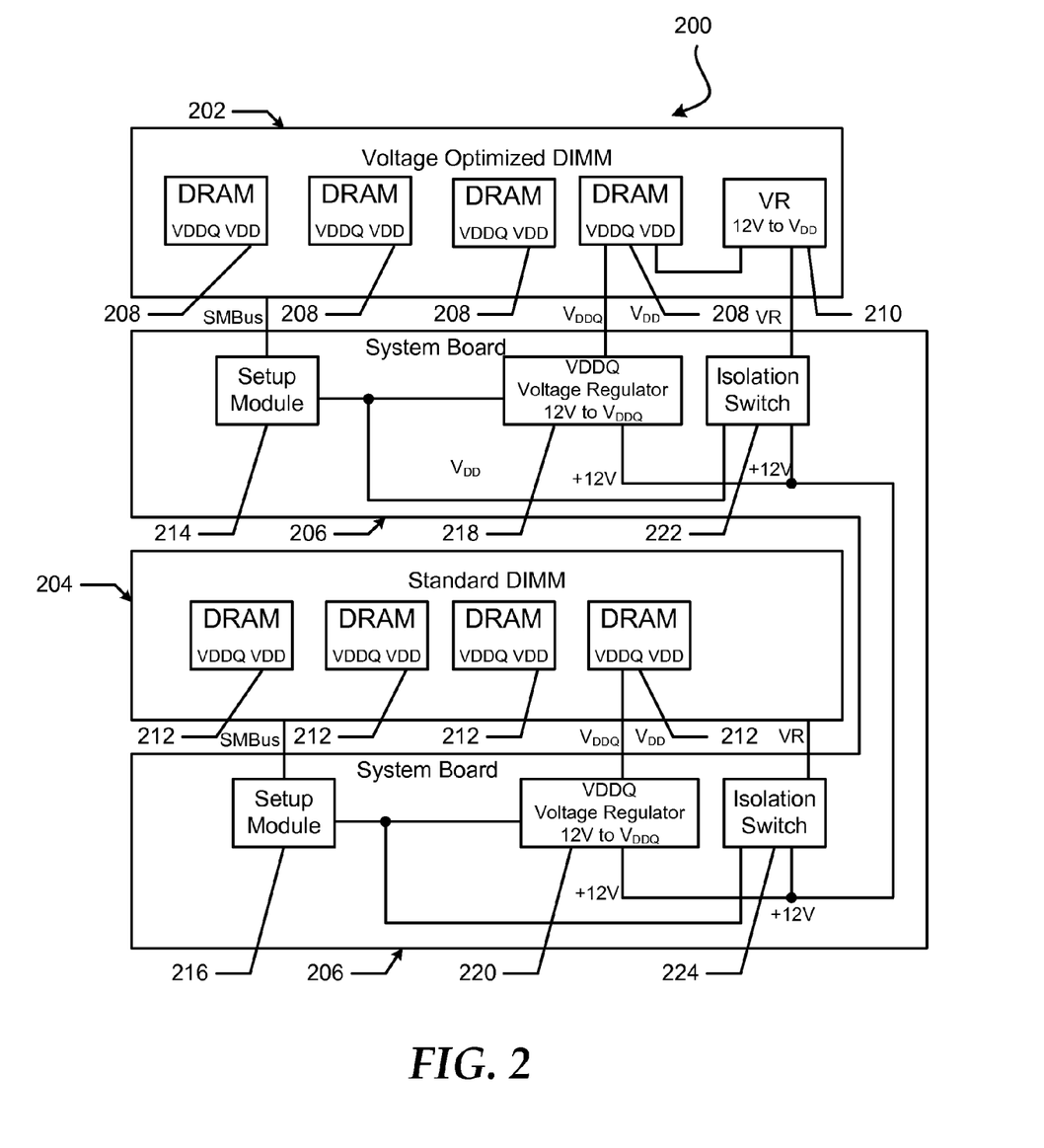
FIG. 2 is a block diagram of an alternative embodiment of the information handling system.

FIG. 2 shows an information handling system 200 including a voltage optimized DIMM 202, a standard DIMM 204, and a system board 206. The DIMM 202 includes DRAMs 206 and a voltage regulator 208. The DIMM 204 includes DRAMs 210. The system board 206 includes setup modules 212 and 214, voltage regulators 216 and 218, and isolation switches 220 and 222. The DRAMs 208 are in communication with the voltage regulators 210 and 218. The voltage regulator 210 is in communication with the isolation switch 222. The setup module 214 is in communication with the DIMM 202, the voltage regulator 218, and the isolation switch 222. The DRAMs 212 are in communication with the voltage regulator 220. The setup module 216 is in communication with the DIMM 204, with the voltage regulator 220, and with the isolation switch 224.

When the DIMMs 202 and 204, and the system board 206 are activated, the setup modules 214 and 216 can read the SPD for each of the DIMMs. The information in the SPD can enable the setup modules 214 and 216 to automatically determine the different parameters about the DIMMs 202 and 204. For example, based on the SPD, the setup module 214 can determine that the DIMM 202 is a voltage optimized DIMM, and the setup module 216 can determine that the DIMM 204 is a standard DIMM.

Upon the setup module 214 determining from the SPD that the DIMM 202 is voltage optimized, the setup module can send an optimized signal to the voltage regulator 218 and to the isolation switch 222. The optimized signal can enable the voltage regulator 218 and the isolation switch 222. The voltage regulator 218 can receive a twelve volt input voltage, regulate the input voltage into a $V_{DDQ}$ voltage, and provide the $V_{DDQ}$ voltage to VDDQ pins of the DRAMs 208 via the VDDQ pins of the DIMM 202. The DDR bus portion (not shown) of the DRAMs 208 preferably operates at the $V_{DDQ}$ voltage. Different types of DIMMs 202 have different operating voltages for the portions of the DIMM that use the $V_{DDQ}$ voltage. Thus, based on the type of the DIMM 202 read in the SPD, the voltage regulator 218 can be set to provide the $V_{DDQ}$ voltage at different voltages, or the DIMM can adjust the $V_{DDQ}$ voltage to meet a specific operating voltage through additional voltage conversions.

Additionally, the optimized signal can enable the isolation switch 222, such that the isolation switch provides the twelve volts voltage to the voltage regulator 210 via the VR pins of the DIMM 202. The voltage regulator 210 can regulate the twelve volt voltage to provide a $V_{DD}$ voltage to the DRAMs 208 via the VDD pin of the DRAM. The core portion of the DRAMs 208 preferably operates at the $V_{DD}$ voltage.

When the setup module 216 determines from the SPD that the DIMM 204 is a standard DIMM, the setup module can send a standard signal to the voltage regulator 220 and to the isolation switch 224. The standard signal can enable the voltage regulator to operate as described above to provide the $V_{DDQ}$ voltage to the DRAMs 212. The standard signal can disable the isolation switch 224, such that the twelve volt voltage is not provided to the DIMM 204. Thus, the DIMM 204 utilizes the $V_{DDQ}$ voltage to provide the necessary voltages to the different components in the DIMM. The system board 206 can preferably connect to multiple DIMMs, and each DIMM can be either a standard DIMM or a voltage optimized DIMM. The system board 206 can enable or disable each isolation switch based on the SPD from the DIMM associated with the specific isolation switch.

Figure 3:
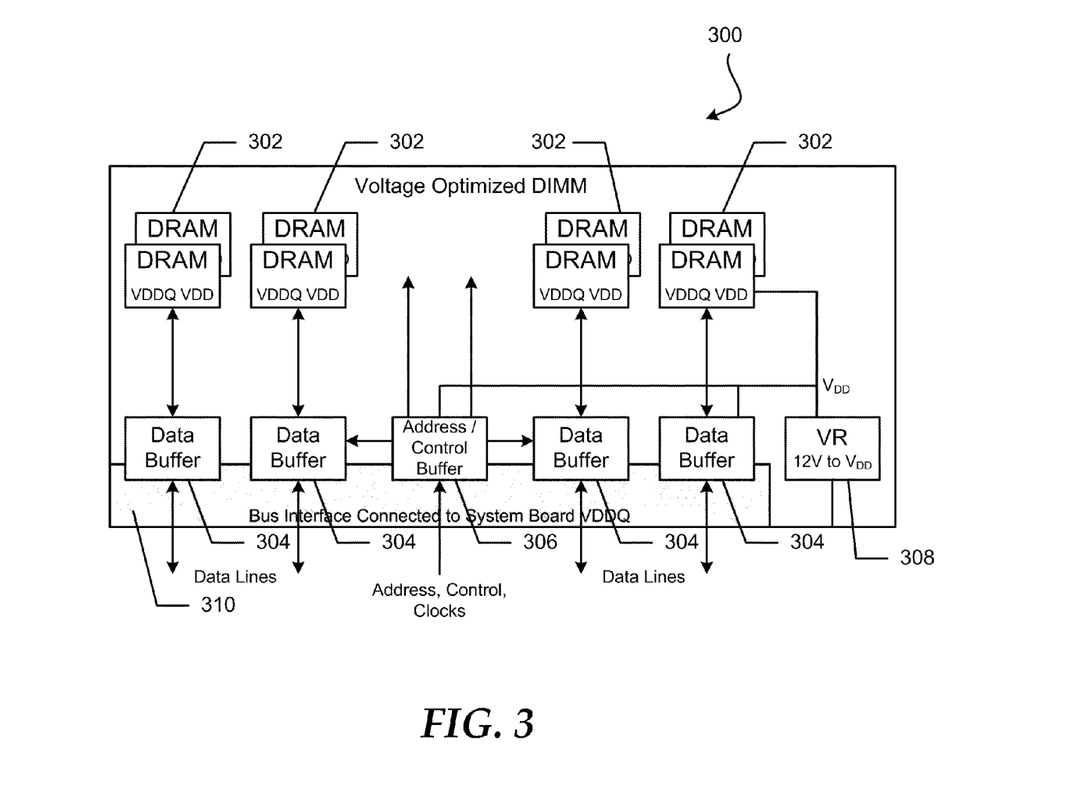
FIG. 3 is a block diagram of an embodiment of the voltage optimized dual in-line memory module.

FIG. 3 shows an embodiment of the voltage optimized DIMM 300 including a plurality of DRAMs 302, a plurality of data buffers 304, an address control buffer 306, and a voltage regulator 308. The DRAMs 302 are in communication with the data buffers 304, with the address control buffer 306, and with the voltage regulator 308. The data buffers 304 are in communication with the address control buffer 306, with the voltage regulator 308, with a bus interface 310, and with data lines from a system board. The address control buffer 306 is in communication with the voltage regulator 308, with the bus interface 310, and with address, control, and clock signals from the system board.

The voltage regulator 308 is preferably connected to a plurality of the VDD pins of the DIMM 300, and the bus interface 310 is preferably connected to a different plurality of VDD pins. The plurality of VDD pins connected to the voltage regulator 308 preferably receive twelve volts from the system board, and the plurality of VDD pins connected to the bus interface 310 preferably receive a $V_{DDQ}$ voltage. The $V_{DDQ}$ voltage can vary based on the DIMM 300 and the system board. Thus, the DIMM 300 can receive two different voltages on the VDD pins from the system board, and one of the voltages can be provided to the bus interface 310 and the other voltage can be provided to the voltage regulator 308.

Even though the operating voltage level core portion for the DRAMs 302 can be lowered, the operating voltage level for the address control buffer 306 should preferably remain the same. However, in a standard DIMM, if the voltage applied to the DIMM is lowered to meet an operating voltage of the DRAMs 302, the address control buffer 306 has to also run at the lower voltage. Alternatively, the operating voltage, $V_{DDQ}$, of the address control buffer 306 for the voltage optimized DIMM 302 can be supplied via the VDDQ pins and the lower operating voltage for the core portion of the DRAMs 302 can be provided by the voltage regulator 308. The same VDDQ voltage can also be provided to the bus interface 310. Because the $V_{DDQ}$ voltage is not reduced with changes to the operating voltage of the core portion of the DRAMs 302, the input/output driver swing can remain substantially the same. The input/output driver swing can be the voltage difference between a high state and a low state of a switching frequency of the input/output driver. Thus, the channel frequency can be kept higher when the $V_{DDQ}$ voltage is higher than when the $V_{DDQ}$ voltage is lower.

Figure 4:
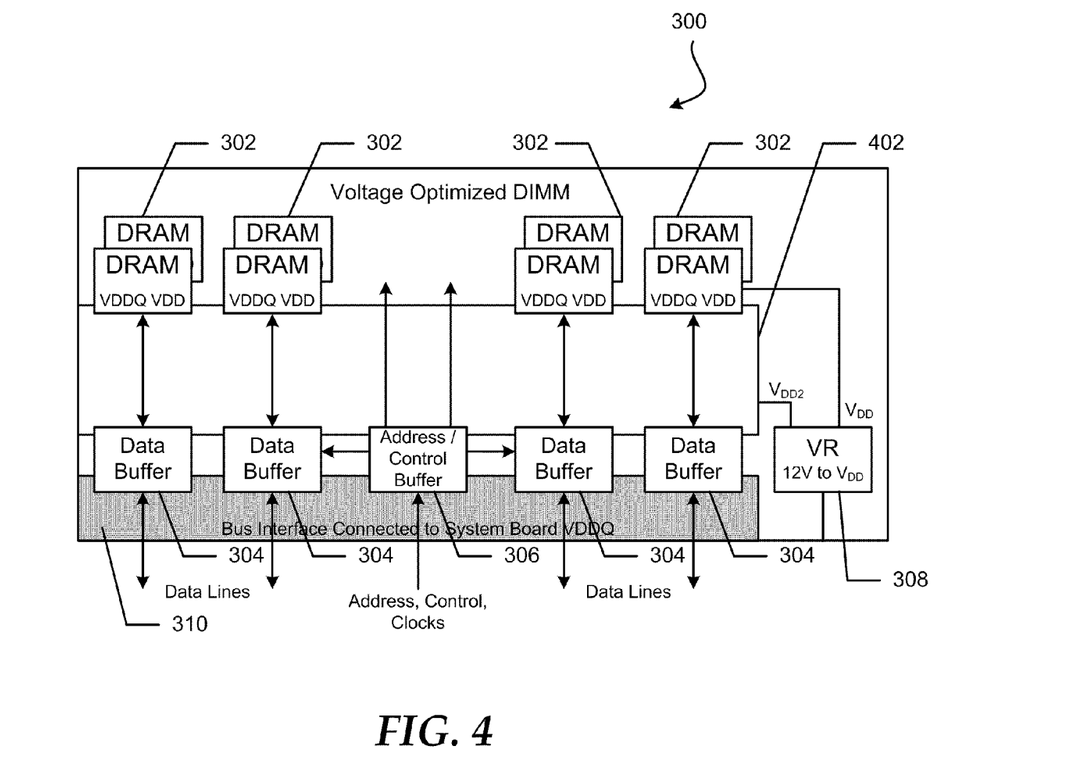
FIG. 4 is a block diagram of an alternative embodiment of the voltage optimized dual in-line memory module.

The voltage regulator 308 can regulate the twelve volts to a $V_{DD}$ voltage, and can provide the $V_{DD}$ voltage to the DRAMs 302, the data buffers 304, and the address control buffer 304. Thus, the voltage regulator 308 can provide the operating voltage for the core portion of the DRAMs 302, the data buffers 304, and the address control buffer 306. Alternatively, the DRAMs 302, the data buffers 304, and the address control buffer 306 can also have different portions that operate at a third voltage. For example, a portion of the DRAMs 302, the data buffers 304, and the address control buffer 306 can be connected to a voltage rail 402 shown in FIG. 4. The voltage regulator 308 can provide a $V_{DD2}$ voltage to the voltage rail 402, and the voltage rail can preferably provide the $V_{DD2}$ voltage to the DRAMs 302, the data buffers 304, and the address control buffer 306. In another embodiment, the voltage regulator 308 can provide different regulated voltages to the data buffers 304 and to the DRAMs 302. Thus, the DIMM 300 can receive two different input voltages from the VDD pins connected to the system board, and based on the two input voltages and the voltage regulator 308, the DIMM can provide the DRAMs 302, the data buffers 304, and the address control buffer 306 with the necessary operating voltages for each portion of the components. It should be understood that even though the voltage regulator 308 is shown only connected to one of the DRAMs 302 and to one of the data buffers 304, the voltage regulator preferably provides the $V_{DD}$ voltage to each of the DRAMs and to each of the data buffers.

Figure 5:
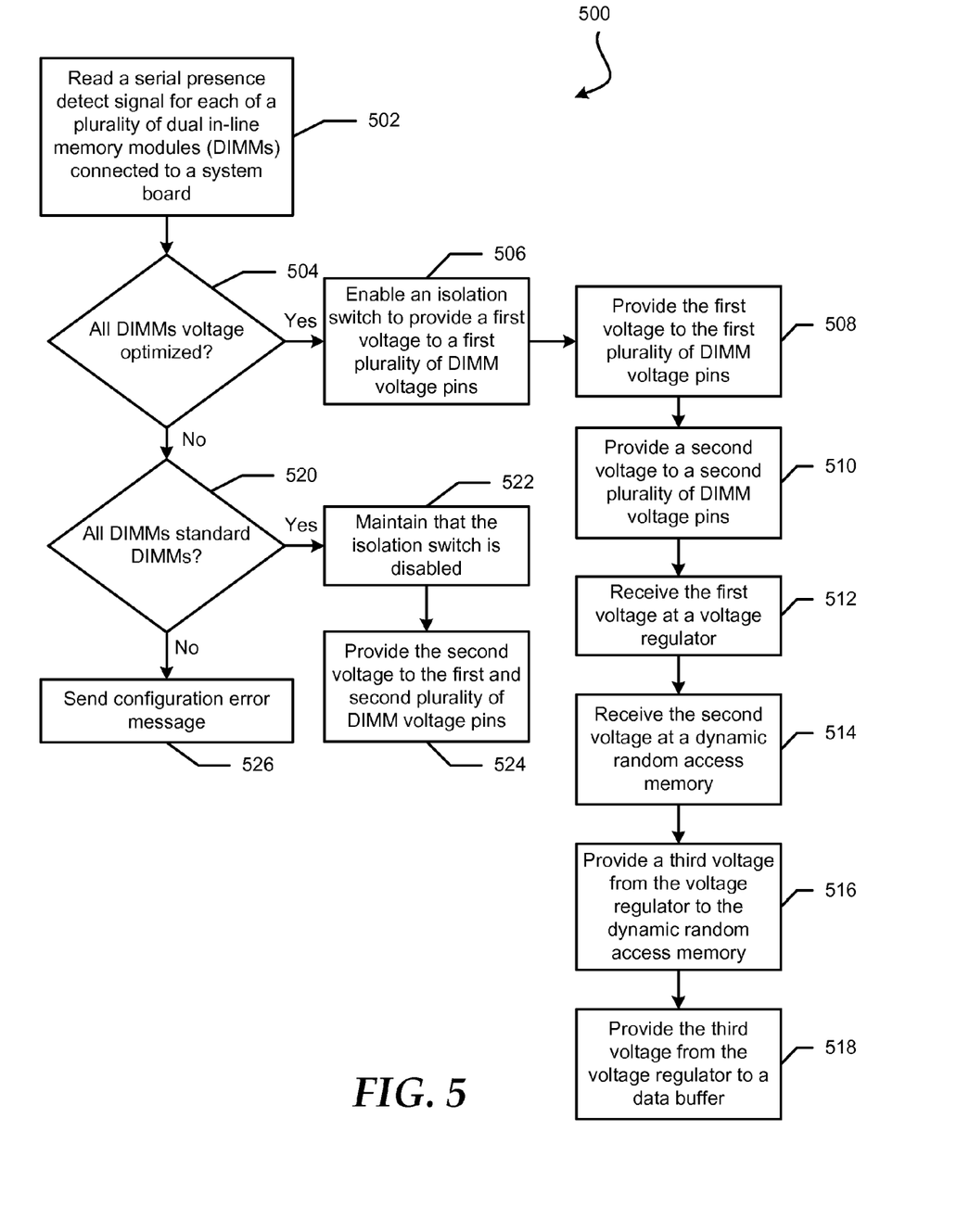
FIG. 5 is a flow diagram of a method for completing a power sequence of a dual in-line memory module in a combination system board.

FIG. 5 is a flow diagram of a method 500 for completing a power sequence of a dual in-line memory module in a combination system board. At block 502, a serial presence detect for each DIMM connected to a system board is read. At block 504, a determination is made whether all of the DIMMs are voltage optimized. If all of the DIMMs are voltage optimized, an isolation switch to provide a first voltage to a first plurality of DIMM voltage pins is enabled at block 506. At block 508, the first voltage is provided to the first plurality of DIMM voltage pins. A second voltage is provided to a second plurality of DIMM voltage pins at block 510. At block 512, the first voltage is received at a voltage regulator. The second voltage is received at a dynamic random access memory at block 514. At block 516, a third voltage is provided from the voltage regulator to the dynamic random access memory. The third voltage is provided from the voltage regulator to a data buffer at block 518.

At block 520, if each of the plurality of DIMMs are not voltage optimized, a determination is made whether each of the plurality of DIMMs are standard DIMMs. If each of the plurality of DIMMs are standard DIMMs, it is maintained that the isolation switch is disabled at block 522. At block 524, the second voltage is provided to the first and second plurality of DIMM voltage pins. If each of the DIMMs are not standard DIMMs, a configuration error message is sent at block 526.

Figure 6:
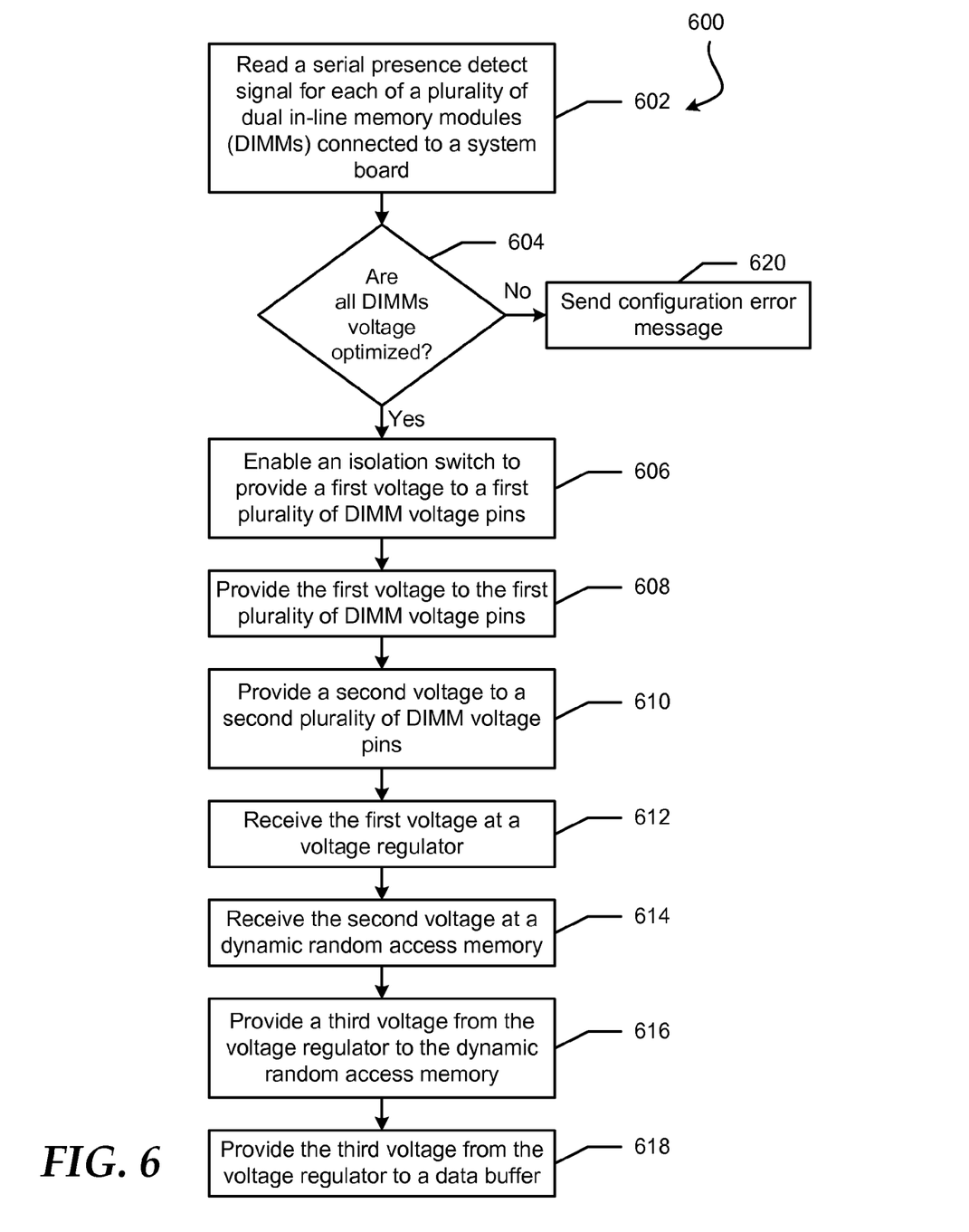
FIG. 6 is a flow diagram of a method for completing the power sequence of a dual in-line memory module in a voltage optimized system board.

FIG. 6 is a flow diagram of a method 600 for completing the power sequence of a dual in-line memory module in a voltage optimized system board. At block 602, a serial presence detect for each DIMM connected to a system board is read. At block 604, a determination is made whether all of the DIMMs are voltage optimized. If all of the DIMMs are voltage optimized, an isolation switch to provide a first voltage to a first plurality of DIMM voltage pins is enabled at block 606. At block 608, the first voltage is provided to the first plurality of DIMM voltage pins. A second voltage is provided to a second plurality of DIMM voltage pins at block 610. At block 612, the first voltage is received at a voltage regulator. The second voltage is received at a dynamic random access memory at block 614. At block 616, a third voltage is provided from the voltage regulator to the dynamic random access memory. The third voltage is provided from the voltage regulator to a data buffer at block 618. At block 620, if each of the plurality of DIMMs are not voltage optimized, a configuration error message is sent.

Figure 7:
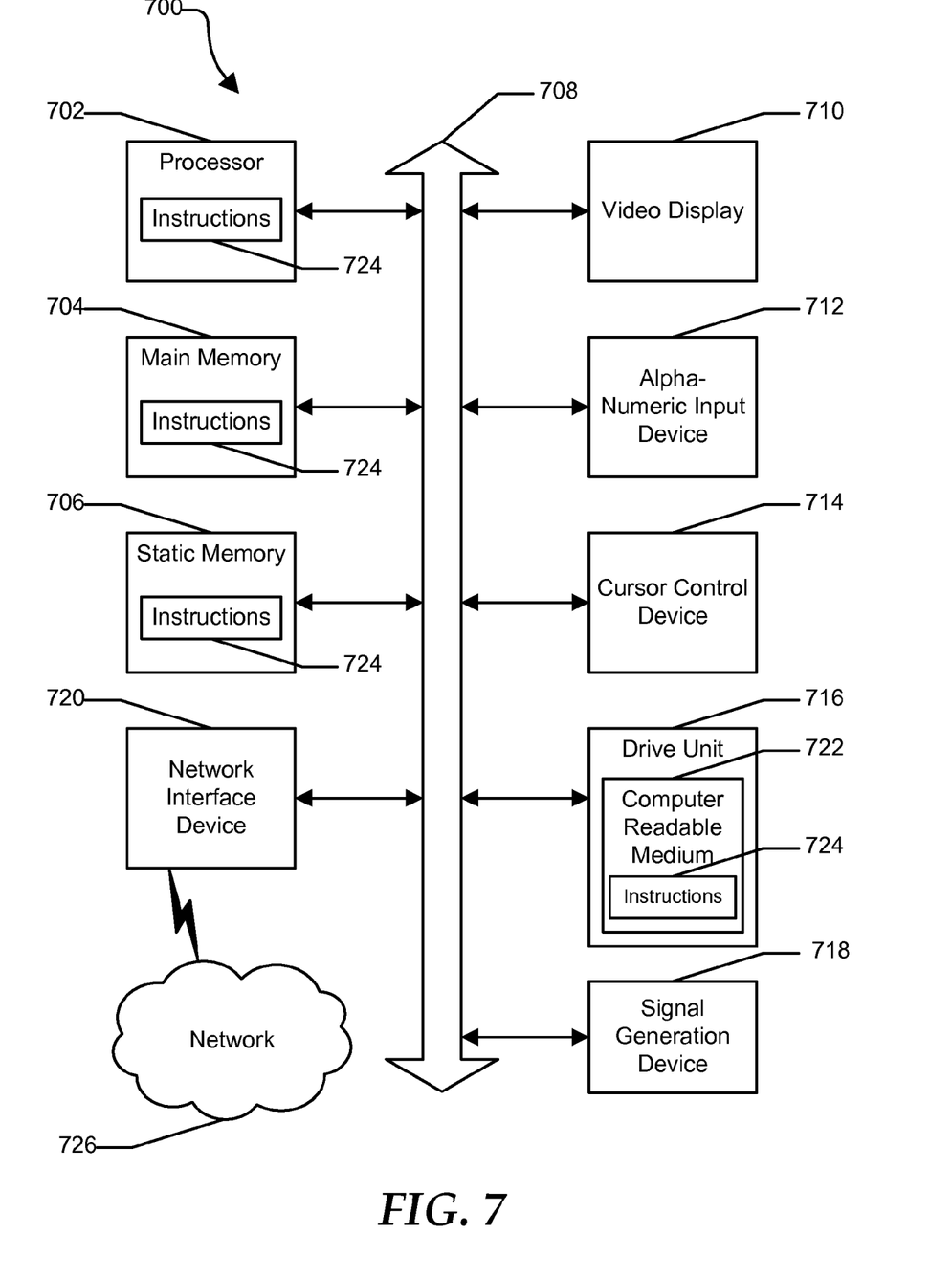
FIG. 7 is a block diagram of a general computer system.

FIG. 7 shows an illustrative embodiment of a general computer system 700 in accordance with at least one embodiment of the present disclosure. The computer system 700 can include a set of instructions that can be executed to cause the computer system to perform any one or more of the methods or computer based functions disclosed herein. The computer system 700 may operate as a standalone device or may be connected, e.g., using a network, to other computer systems or peripheral devices.

In a networked deployment, the computer system may operate in the capacity of a server or as a client user computer in a server-client user network environment, or as a peer computer system in a peer-to-peer (or distributed) network environment. The computer system 700 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular embodiment, the computer system 700 can be implemented using electronic devices that provide voice, video or data communication. Further, while a single computer system 700 is illustrated, the term "system" shall also be taken to include any collection of systems or sub-systems that individually or jointly execute a set, or multiple sets, of instructions to perform one or more computer functions.

The computer system 700 may include a processor 702, e.g., a central processing unit (CPU), a graphics processing unit (GPU), or both. Moreover, the computer system 700 can include a main memory 704 and a static memory 706 that can communicate with each other via a bus 708. As shown, the computer system 700 may further include a video display unit 710, such as a liquid crystal display (LCD), an organic light emitting diode (OLED), a flat panel display, a solid state display, or a cathode ray tube (CRT). Additionally, the computer system 700 may include an input device 712, such as a keyboard, and a cursor control device 714, such as a mouse. The computer system 700 can also include a disk drive unit 716, a signal generation device 718, such as a speaker or remote control, and a network interface device 720.

In a particular embodiment, as depicted in FIG. 7, the disk drive unit 716 may include a computer-readable medium 722 in which one or more sets of instructions 724, e.g. software, can be embedded. Further, the instructions 724 may embody one or more of the methods or logic as described herein. In a particular embodiment, the instructions 724 may reside completely, or at least partially, within the main memory 704, the static memory 706, and/or within the processor 702 during execution by the computer system 700. The main memory 704 and the processor 702 also may include computer-readable media. The network interface device 720 can provide connectivity to a network 726, e.g., a wide area network (WAN), a local area network (LAN), or other network.

In an alternative embodiment, dedicated hardware implementations such as application specific integrated circuits, programmable logic arrays and other hardware devices can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionality as described herein.

The present disclosure contemplates a computer-readable medium that includes instructions 724 or receives and executes instructions 724 responsive to a propagated signal, so that a device connected to a network 726 can communicate voice, video or data over the network 726. Further, the instructions 724 may be transmitted or received over the network 726 via the network interface device 720.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to capture carrier wave signals such as a signal communicated over a transmission medium. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

Although only a few exemplary embodiments have been described in detail above, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A system comprising:
   a system board including:
      a setup module configured to output an optimized signal if each of a plurality of dual in-line memory modules connected to a system board are voltage optimized dual in-line memory modules, and configured to output a standard signal if each of the plurality of dual in-line memory modules connected to the system board are standard dual in-line memory modules;
      a first voltage regulator in communication with a first plurality of dual in-line memory module voltage pins, the first voltage regulator configured to output a first voltage to the first plurality of dual in-line memory module voltage pins in response to receiving the optimized signal, and further configured to output the first voltage to the first plurality of dual in-line memory module voltage pins in response to receiving the standard signal; and
      an isolation switch in communication with a second plurality of dual in-line memory module voltage pins, the isolation switch configured to output a second voltage to the second plurality of dual in-line memory module voltage pins in response to receiving the optimized signal; and
   a dual in-line memory module connected to the system board, the dual in-line memory module including:
      a dynamic random access memory having a first input terminal connected to the first plurality of dual in-line memory module voltage pins, and a second input terminal, the dynamic random access memory configured to receive the first voltage on the first input terminal; and a second voltage regulator having an input terminal connected to the second plurality of dual in-line memory module voltage pins, and an output terminal connected to the second input terminal of the dynamic random access memory, the second voltage regulator adapted to receive the second voltage, and configured to provide a third voltage to the second input terminal of the dynamic random access memory.

2. The system of claim 1 wherein the isolation switch is further configured to output the first voltage to the second plurality of dual in-line memory module voltage pins in response to receiving the standard signal.

3. The system of claim 1 wherein the first voltage is larger than the second voltage.

4. The system of claim 1 wherein the setup module is further configured to output a configuration error message in response to determining that a first portion of the plurality of dual in-line memory modules is voltage optimized dual in-line memory module, and a second portion of the plurality of dual in-line memory modules is standard dual in-line memory modules.

5. The system of claim 1 wherein the first plurality of dual in-line memory module voltage pins is greater than the second plurality of dual in-line memory module voltage pins.

6. The system of claim 1 wherein the dual in-line memory module further comprises:
a data buffer configured to receive the first voltage from via one of the second plurality of dual in-line memory module voltage pins, and further configured to receive the third voltage from the voltage regulator.

7. The system of claim 1 wherein an internal voltage regulator of the dynamic random access memory is bypassed.

8. A device comprising:
a dynamic random access memory having a first input terminal connected to a first plurality of dual in-line memory module voltage pins, and a second input terminal, the dynamic random access memory configured to receive a first voltage on the first input terminal; and
a voltage regulator having an input terminal connected to a second plurality of dual in-line memory module voltage pins, and an output terminal connected to the second input terminal of the dynamic random access memory, the voltage regulator adapted to receive a second voltage, and configured to provide a third voltage to the second input terminal of the dynamic random access memory, wherein a first portion of the dynamic random access memory is configured to operate at the first voltage, and a second portion of the dynamic random access memory is configured to operate at the third voltage.

9. The device of claim 8 wherein the voltage regulator is further configured to provide a fourth voltage to the dynamic random access memory.

10. The device of claim 9 wherein a first portion of the dynamic random access memory is configured to operate at the third voltage, and a second portion of the dynamic random access memory is configured to operate at the fourth voltage.

11. The device of claim 8 further comprising:
a data buffer configured to receive the first voltage from via one of the plurality of dual in-line memory module voltage pins, and further configured to receive the third voltage from the voltage regulator.

12. The device of claim 11 wherein the data buffer is further configured to receive a fourth voltage from the voltage regulator.

13. The device of claim 12 wherein a first portion of the data buffer is configured to operate at the first voltage, a second portion of the data buffer is configured to operate at the third voltage, and a third portion of the data buffer is configured to operate at the fourth voltage.

14. A method comprising:
receiving a serial presence detect for each of a plurality of dual in-line memory modules connected to a system board;
determining a dual in-line memory module type for each of the plurality of dual in-line memory modules based on the serial presence detect;
if each of the plurality of dual in-line memory modules are voltage optimized dual in-line memory modules, activating an isolation switch in response to determining that each of the plurality of dual in-line memory modules are voltage optimized dual in-line memory modules;
providing a first voltage to a first plurality of dual in-line memory module voltage pins, and a second voltage to a second plurality of dual in-line memory module voltage pins in response to activating the isolation switch;
receiving the first voltage at a dynamic random access memory;
receiving the second voltage at a voltage regulator; and
providing a third voltage from the voltage regulator to the dynamic random access memory.

15. The method of claim 14 further comprising:
providing a fourth voltage from the voltage regulator to the dynamic random access memory.

16. The method of claim 14 further comprising:
if each of the plurality of dual in-line memory modules are standard dual in-line memory modules, providing the first voltage to the first and second plurality of dual in-line memory module voltage pins.

17. The method of claim 14 further comprising:
providing the third voltage from the voltage regulator to a data buffer.

18. The method of claim 14 further comprising:
if a first portion of the plurality of dual in-line memory modules are voltage optimized and a second portion of the plurality of dual in-line memory modules are standard dual in-line memory modules, outputting a configured error signal.

* * * * *